United States Patent
Yang et al.

(10) Patent No.: US 9,391,130 B2
(45) Date of Patent: Jul. 12, 2016

(54) ORGANIC LIGHT EMITTING DISPLAY DEVICE AND METHOD FOR MANUFACTURING THE SAME

(71) Applicant: LG DISPLAY CO., LTD., Seoul (KR)

(72) Inventors: HeeJung Yang, Yangju-si (KR); GyuWon Han, Yeoju-gun (KR); WonJoon Ho, Jeonju-si (KR); Jaekyu Jeong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/543,129

(22) Filed: Nov. 17, 2014

(65) Prior Publication Data
US 2016/0013259 A1    Jan. 14, 2016

(30) Foreign Application Priority Data
Jul. 14, 2014 (KR) .................. 10-2014-0088287

(51) Int. Cl.
*H01L 27/32* (2006.01)
*H01L 29/786* (2006.01)
*H01L 51/56* (2006.01)

(52) U.S. Cl.
CPC ........ *H01L 27/3272* (2013.01); *H01L 29/7869* (2013.01); *H01L 51/56* (2013.01)

(58) Field of Classification Search
CPC .. H01L 27/3272; H01L 29/7869; H01L 51/56
See application file for complete search history.

(56) References Cited

U.S. PATENT DOCUMENTS

| | | | |
|---|---|---|---|
| 2014/0077171 A1* | 3/2014 | Yamakita | G02B 5/201 257/40 |
| 2015/0129852 A1* | 5/2015 | Park | H01L 27/3262 257/40 |

\* cited by examiner

*Primary Examiner* — Long Pham
(74) *Attorney, Agent, or Firm* — Dentons US LLP

(57) ABSTRACT

Disclosed are an organic light emitting display device and a manufacturing method. The organic light emitting display device includes: a data line arranged in a first direction on a substrate; a gate line arranged in a second direction on the substrate; a thin film transistor arranged at a crossing of the gate line and the data line; a pixel electrode connected to a source electrode or a drain electrode of the thin film transistor and corresponding to a white pixel region; a low reflection layer arranged opposite the white pixel region; and a light shield layer arranged opposite to the thin film transistor.

9 Claims, 20 Drawing Sheets

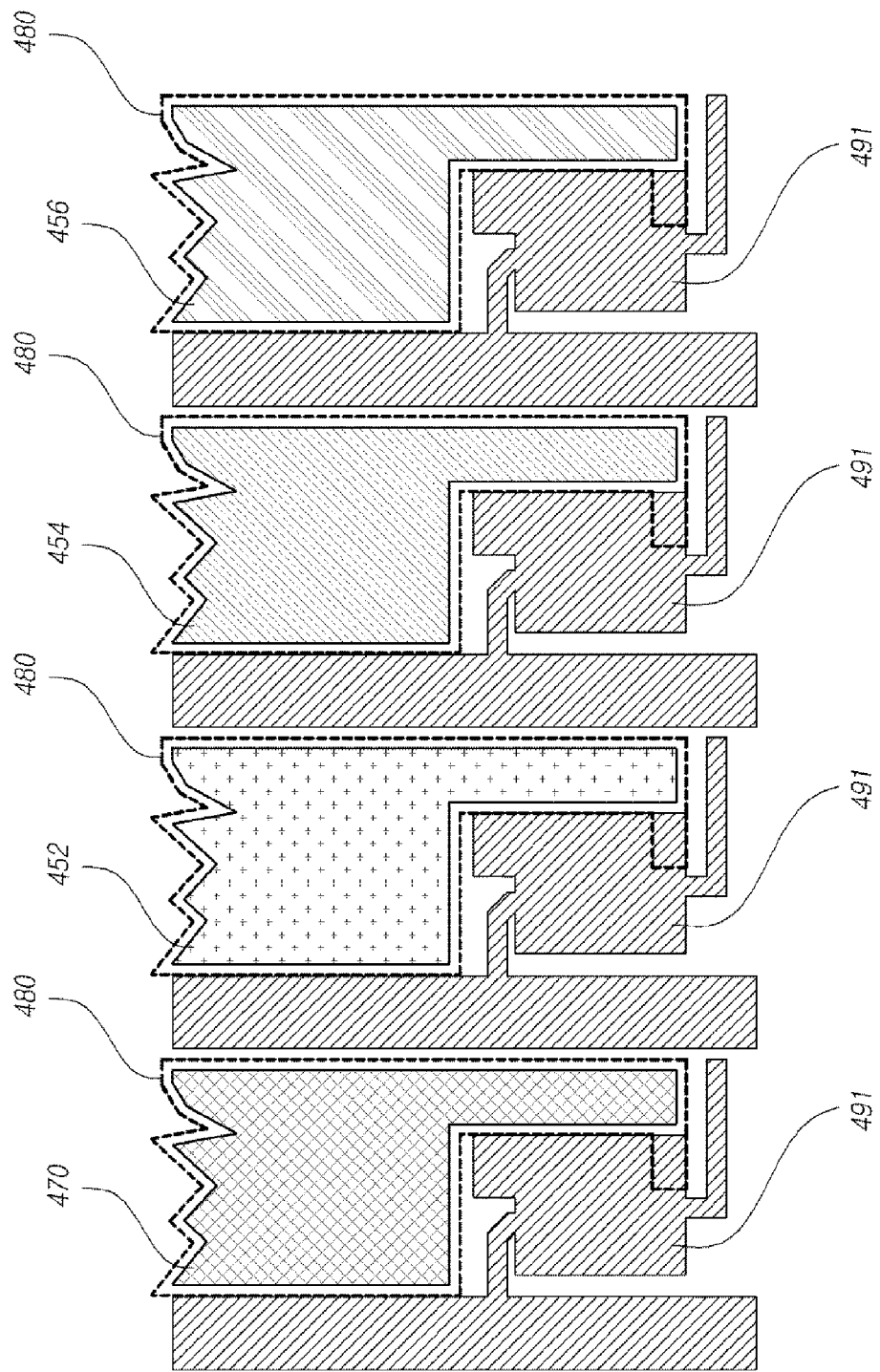

ORGANIC LIGHT EMITTING DISPLAY DEVICE AND METHOD FOR MANUFACTURING THE SAME

CROSS-REFERENCE TO RELATED APPLICATION

This application claims priority from and the benefit under 35 U.S.C. §119(a) of Korean Patent Application No. 10-2014-0088287, filed on Jul. 14, 2014, which is hereby incorporated by reference for all purposes as if fully set forth herein.

BACKGROUND OF THE INVENTION

1. Field of the Invention

The present invention relates to a display device for displaying an image.

2. Description of the Related Art

With the development of the information society, various types of requirements expected of display devices for displaying an image have increased, and in recent years, various display devices such as liquid crystal display (LCD), plasma display panel (PDP), and organic light emitting diode display (OLED) devices have been used. Each of these various display devices includes a display panel suitable for the corresponding display device.

Such a display panel included in the display device may be one of a plurality of display panels that are produced from one substrate. That is, elements, signal lines, power lines, and the like that constitute pixels in one substrate are formed in units of display panels through several processes, and then the substrate can be cut into unit display panels by using scribing equipment to produce a plurality of display panels.

External light incident on a display device is reflected by constituent elements of the display device, such as wirings, and the reflected light exits to the outside of the display device. This may cause an overlap with an image output from the display device, and thereby degrade the quality of the image. Therefore, there is a need for a technology for reducing reflection of incident light.

SUMMARY OF THE INVENTION

In view of this, an aspect of the present invention is to provide a display device that includes a low reflection layer for reducing reflection of external light, which is generated in a white pixel region when a polarizing film or polarizing plate is removed from the display device, and a method for manufacturing the same.

In accordance with an aspect of the present invention, there is provided an organic light emitting display device including: a data line arranged in a first direction on a substrate; a gate line being arranged in a second direction on the substrate; a thin film transistor arranged at a crossing of the gate line and the data line; a pixel electrode connected to a source electrode or a drain electrode of the thin film transistor and corresponding to a white pixel region; a low reflection layer arranged opposite to the white pixel region; and a light shield layer arranged opposite to the thin film transistor.

In accordance with another aspect of the present invention, there is provided a method for manufacturing an organic light emitting display device, the method including: forming a light shield layer on a substrate in a display region defining a plurality of pixel regions formed by crossing gate wirings for transmitting gate signals and data wirings for transmitting data signals on the substrate, the light shield layer corresponding to each pixel region; forming a buffer layer, an active layer, a gate, and an interlayer dielectric layer on the light shield layer; forming a low reflection layer in a source/drain electrode region of the interlayer dielectric layer and forming a low reflection layer in a white pixel region; and forming a source/drain electrode.

In accordance with yet another aspect of the present invention, there is provided a method for manufacturing an organic light emitting display device, the method including: forming a light shield layer on a substrate in a display region defining a plurality of pixel regions formed by crossing gate wirings for transmitting gate signals and data wirings for transmitting data signals on the substrate, the light shield layer corresponding to each pixel region; forming a buffer layer and an active layer on the light shield layer; forming a gate dielectric layer; forming a low reflection layer on the gate dielectric layer and forming a low reflection layer in a white pixel region of the buffer layer; and forming a gate, an interlayer dielectric layer, and a source/drain electrode.

As described above, the present invention can provide a display device that includes a low reflection layer for reducing the reflectance to external light, which is generated in a white pixel region when a polarizing film or polarizing plate is removed from the display device, and a method for manufacturing the same.

BRIEF DESCRIPTION OF THE DRAWINGS

The above and other objects, features and advantages of the present invention will be more apparent from the following detailed description taken in conjunction with the accompanying drawings, in which:

FIGS. 4A to 4C illustrate Example 1-1 of the present invention;

DETAILED DESCRIPTION OF THE EXEMPLARY EMBODIMENTS

Figure 1:
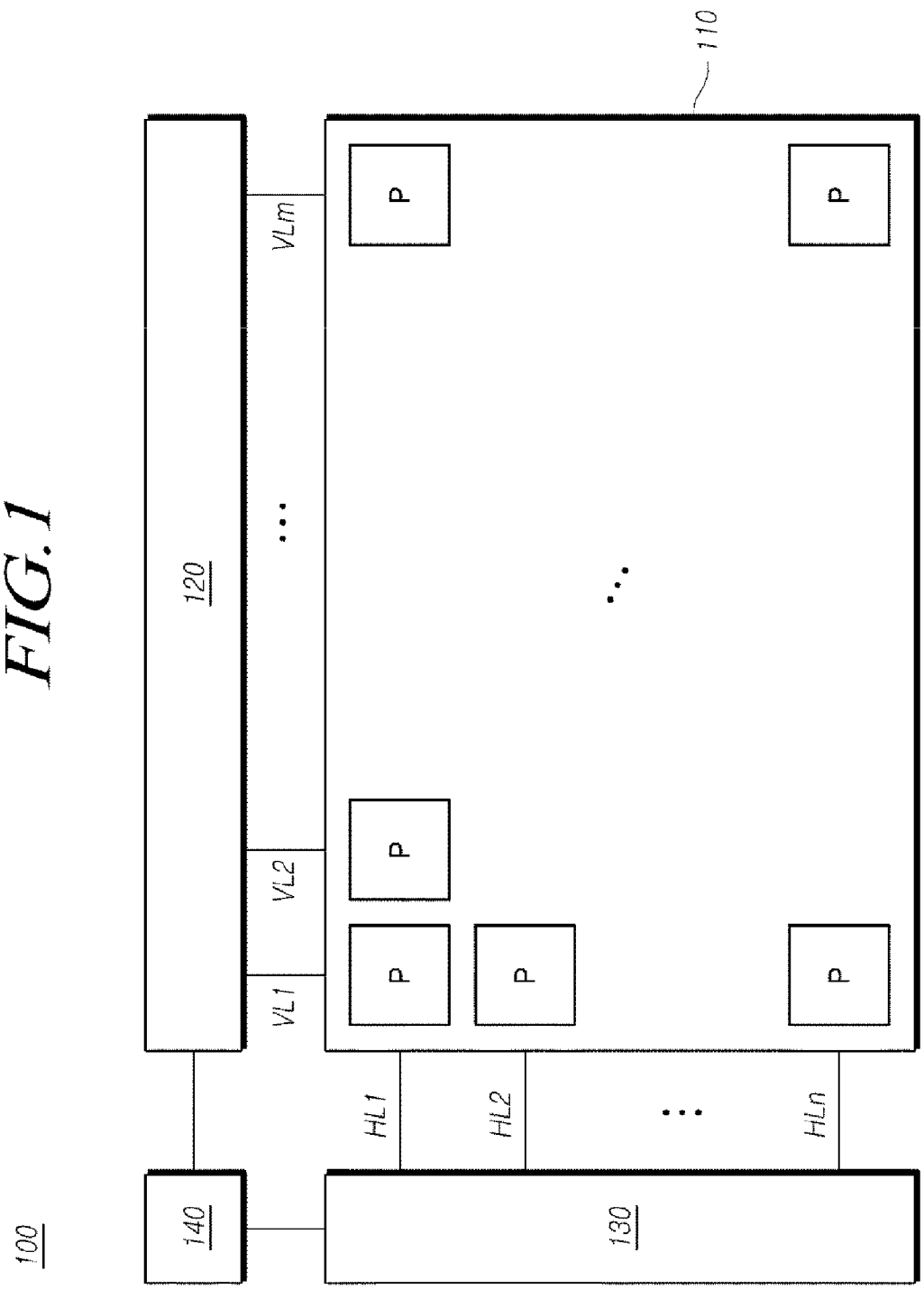
FIG. 1 is a schematic view illustrating a display device according to embodiments of the present invention.

Hereinafter, exemplary embodiments of the present invention will be described in detail with reference to the accompanying drawings. In the following description and drawings, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms such as first, second, A, B, (a), and (b) may be used herein when describing elements of the present invention. Each of these terms is merely used to distinguish one element from other elements, and the nature, order, sequence, number, and the like of the corresponding element is not limited by the term. It should be noted that if it is described in the specification that one element is "connected," "coupled" or "joined" to another element, a third element may be "connected," "coupled," and "joined" between the first and second elements, although the first element may be directly connected, coupled or joined to the second element.

FIG. 1 schematically illustrates a display device according to embodiments of the present invention.

Referring to FIG. 1, the display device 100 according to embodiments of the present invention includes a display panel 110 having a plurality of first lines VL1 to VLm formed in a first direction (e.g., vertical direction) and a plurality of second lines HL1 to HLn formed in a second direction (e.g., horizontal direction), a first driving unit 120 for supplying a first signal to the plurality of first lines VL1 to VLm, a second driving unit 130 for supplying a second signal to the plurality of second lines HL1 to HLn, and a timing controller 140 for controlling the first driving unit 120 and the second driving unit 130.

As the plurality of first lines VL1 to VLm formed in the first direction (e.g., vertical direction) and the plurality of second lines HL1 to HLn formed in the second direction (e.g., horizontal direction) cross each other, a plurality of pixels P are defined in the display panel 110.

Each of the first driving unit 120 and the second driving unit 130 may include at least one driver integrated circuit for outputting a signal for image display.

As an example, the plurality of first lines VL1 to VLm formed in the first direction in the display panel 100 may be data wirings, formed in the vertical direction (first direction), for transmitting data voltages (first signals) to vertical rows of pixels, and the first driving unit 120 may be a data driving unit for supplying data voltages to the data wirings.

Further, the plurality of second lines HL1 to HLn formed in the second direction in the display panel 110 may be gate wirings, formed in the horizontal direction (second direction), for transmitting scan signals (second signals) to horizontal rows of pixels, and the second driving unit 130 may be a gate driving unit for supplying scan signals to the gate wirings.

Further, pad portions are formed in the display panel 110 to be connected to the first drive unit 120 and the second drive unit 130. When the first driving unit 120 supplies first signals to the plurality of first lines VL1 to VLm, the pad portions transfer the first signals to the display panel 110, and likewise, when the second driving unit 130 supplies second signals to the plurality of second lines HL1 to HLn, the pad portions transfer the second signals to the display panel 110. Accordingly, the pad portions may be formed together in the process of forming the pixel regions in the display panel 110.

Figure 2:
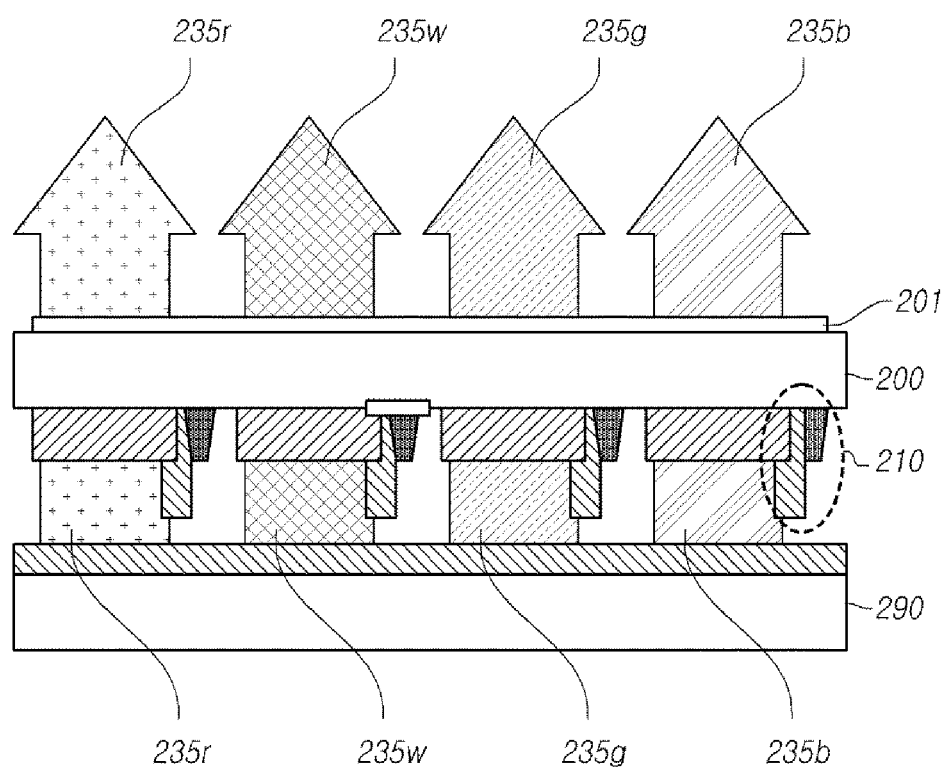
FIG. 2 is a view showing an example of limiting reflectivity for ambient incident light by applying a polarizing plate.

FIG. 2 shows an example of limiting reflectivity for ambient incident light by applying a polarizing plate. FIG. 2 depicts a part of an organic light emitting display device.

The organic light emitting display device of FIG. 2 includes an encapsulation unit 290 and a glass substrate 200. A polarizing plate 201 is formed on one side of the glass substrate 200, and thin film transistors 210 and pixel regions 230r, 230g, 230w, 230b are formed on the opposite side of the glass substrate 200. A color filter is formed in the red (R), green (G), and blue (B) regions 230r, 230g, 230b of the pixel regions respectively, and light generated in the organic light emitting layer emits from the pixel regions 230r, 230w, 230g, 230b, as indicated by arrows 235r, 235w, 235g, 235b. The polarizing plate 201 shields external light (or ambient light) from entering the organic light emitting display device from the outside, and transmits light emitting from the organic light emitting layer toward the outside.

Figure 3:
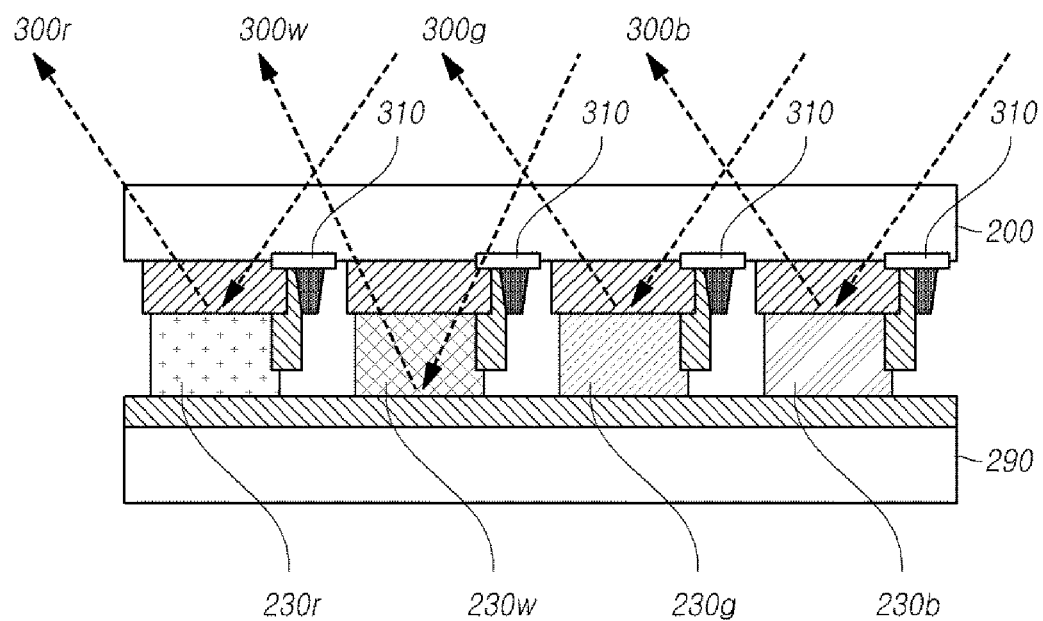
FIG. 3 is a view showing light reflection in a white pixel region when the polarizing plate is removed.

FIG. 3 shows light reflection in the white pixel region when the polarizing plate is removed.

When the polarizing plate is removed, external light is not allowed to enter the display device in regions where light shield layers 310 are formed respectively. However, in regions where no light shield layer is formed, external light is incident and reflected. Among the regions where no light shield layer is formed, the pixel regions 230r, 230g, 230g, in each of which the color filter is formed, reflect 20 to 30% of incident light, but the white pixel region 230w reflects 70 to 90% of incident light because a separate color filter is not formed in that region and thus the incident light is reflected on the metal portion.

In the case of no polarizing plate, each of the red, green, and blue pixel regions 230r, 230g, 230b reflects only about 20% of external light incident thereon due to its color filter. More specially, the red filter region has a reflectance of 20% or less, and the green and blue filter regions have a reflectance of 10% less respectively. However, since the white pixel region has no separate color filter, it reflects 70 to 90% of external incident light.

That is, when unpolarized external light is incident due to the removal of the polarizing film, there is a need to reduce reflection of external light by controlling the reflectance of the white pixel region. When the polarizing film is removed, the overall average reflectance is increased because the pixel electrode has high reflectivity, which deteriorates visual sensitivity. There is also a need to reduce costs by adding no separate process or applying a minimal process in the process of forming a low reflection layer.

A first embodiment of the present invention is intended to solve the problem with light reflection even in a display device having no polarizing plate by forming a reflection-reducing material in a white pixel region. In addition, in order to reduce reflection of external light in every pixel region and thin film transistor region when there is no polarizing plate, a second embodiment of the present invention considers a method to form different types of low reflection layers in the thin film transistor region and the pixel region.

Both the first and second embodiments of the present invention may be applied to any thin film transistor (TFT) structure that is typical in the development of semiconductor and display elements. For example, they may be applied to a bottom gate structure, a top gate structure, a double gate structure, a coplanar structure, and the like. Also, they may be applied to a structure having no polarizing film or polarizing plate.

When the first and second embodiments of the present invention are employed, the active layer of a thin film transistor may be made of any type of semiconductor material including a Si-based material, an oxide-based material, a graphene-based material containing carbon nanotubes (CNT), a nitride-based material, and an organic semiconductor.

When the first and second embodiments of the present invention are employed, wirings, such as source, drain, and gate electrodes, of a thin film transistor may be made of, but are not limited to, Cu, Al, Au, Ag, Ti, Mo, W, Ta, and an alloy of one or more thereof, and examples of alloying elements may include, but are not limited to, Ca, Mg, Zn, Mn, Ti, Mo, Ni, Nd, Zr, Cd, Au, Ag, Co, Fe, Rh, In, Ta, Hf, W, and Cr.

Both the first and second embodiments of the present invention are directed to forming a low reflection layer, and particularly a low reflection layer formed in a pixel region may be applied to include a layer for inducing the cavity effect.

First, the first embodiment of the present invention will be discussed.

The first embodiment provides examples of improving the deterioration of visual sensitivity due to the high reflectance of a white pixel region in an organic light emitting display device from which a polarizing film is removed. As Example 1-1, low reflectivity and thus excellent visual sensitivity can be ensured by forming a thin low reflection layer under an electrode used as an anode electrode or a pixel electrode. As Example 1-2, reduced reflection of external light and thus excellent visual sensitivity can be ensured by forming a light shield layer and also forming a low reflection layer made of the same material as that of the light shield layer in a region opposite to a white pixel region.

Figure 4A:
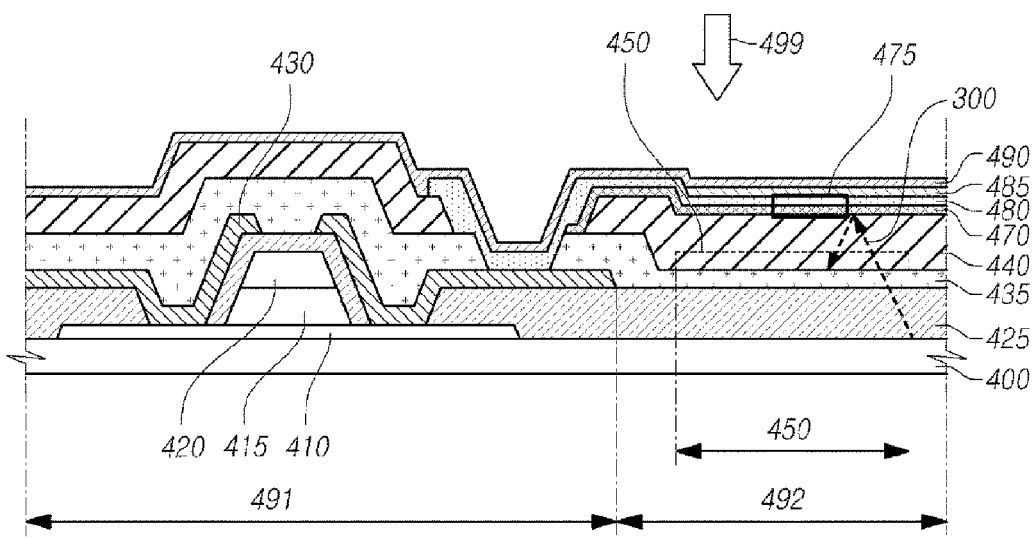
Figure 4B:
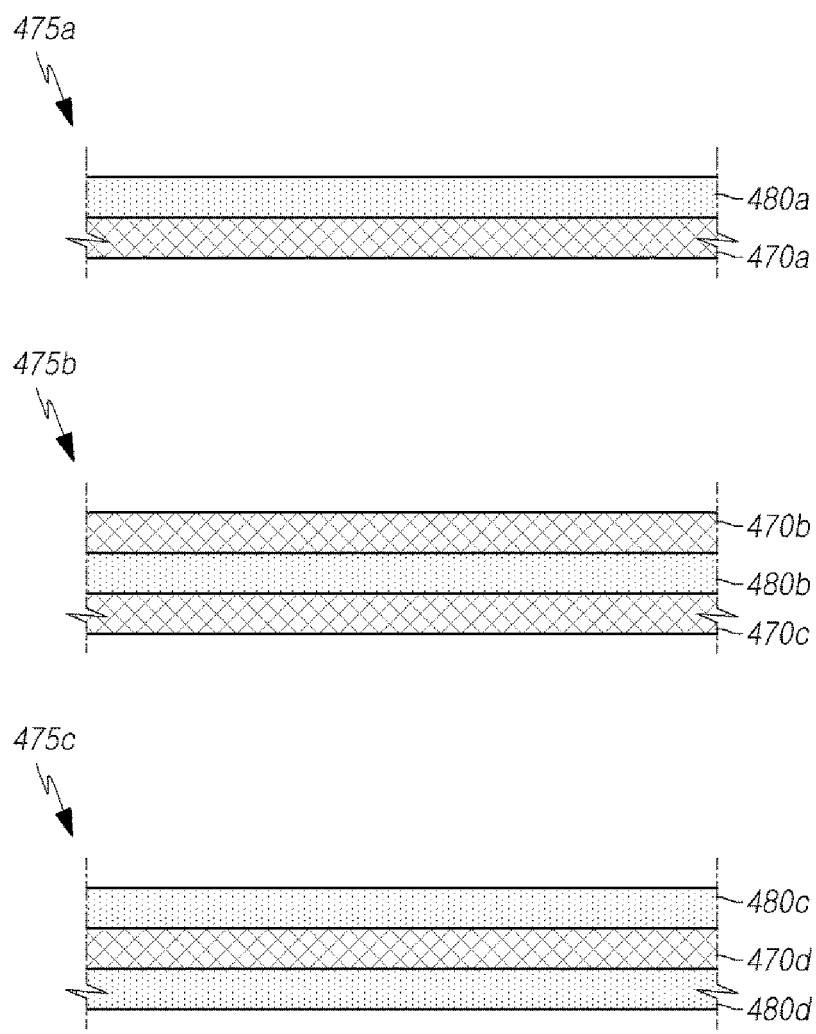

FIGS. 4A to 4C illustrate Example 1-1 of the present invention.

FIG. 4A is a sectional view of a structure in which a low reflection layer is formed in a pixel electrode region corresponding to a white pixel region according to Example 1-1 of the present invention.

In a thin film transistor (TFT) region 491 on a substrate 400, an active layer 410, a gate dielectric layer 415, a gate 420, and an interlayer dielectric (ILD) layer 425 are formed, and the ILD layer 425 is partially etched such that a source/drain electrode 430, a passivation layer 435, and an overcoat 440 are formed. In addition, a pixel electrode 480, an organic layer 485, and a common electrode 490 are formed in a pixel region 492, and no separate color filter is formed in a white pixel region 450 of the pixel region 492.

In FIG. 4A, a low reflection layer 470 that is formed at the pixel electrode 480 corresponding to the white pixel region reduces reflection of external light incident through the white pixel region 450. The white pixel region 450 may correspond to the entire pixel region 492, and may also correspond to a part of the pixel region 492. In FIG. 4A, the white pixel region 450 is indicated by "W" in FIG. 4A for the convenience of clarity. However, since no separate color filter is formed in the white pixel region, there may be no division between the white pixel region 450 and the pixel region 492 when the display device is implemented, and the white pixel region may be formed by forming a barrier rib in a specific portion of the pixel region 492 and defining the portion as the white pixel region 450. These features of the white pixel region are applied to embodiments of the present invention as described below.

The gate 420 and the source/drain electrode 430 are conductive metal layers that may be made of, but are not limited to, at least one selected from the conductive metal group consisting of A, W, Cu, Mo, Cr, Ti, MoW, MoTi, and Cu/MoTi.

The common electrode 490 may be formed as, but is not limited to, an Al cathode. Also, the pixel electrode 480 is a transparent material layer that may be made of, but not limited to, at least one of the group consisting of ITO (indium tin oxide), IZO (indium zinc oxide), and CNT (carbon nanotube).

In FIG. 4A, the low reflection layer as indicated by reference numeral "470" is formed in order to reduce reflectivity in the white pixel region 450. The low reflection layer 470 thinly formed under the pixel electrode 490 corresponding to the transparent electrode of the white pixel region 450 can ensure low reflectivity while minimizing a reduction in luminance. External incident light 300 passes through the white pixel region 450, and experiences reduced reflection on the low reflection layer 470 formed at the pixel electrode 490. The low reflection layer 470 may be formed in combination with ITO of the pixel electrode 490, which is shown in FIG. 4B illustrating the portion designated by reference numeral "475" in an enlarged view.

FIG. 4B shows detailed examples of forming the low reflection layer at the pixel electrode of FIG. 4A.

Several structures of the portion 475 of FIG. 4A are shown in an enlarged scale and indicated by reference numerals "475a", "475b", and "475c".

In the structure of 475a, a low reflection layer 470a is formed on one side of a pixel electrode 480a.

In the structure of 475b, a first low reflection layer 470b and a second low reflection layer 470c are formed on both sides of a pixel electrode 490b.

In the structure of 475c, a low reflection layer 470d is formed between pixel electrodes 480c, 480d.

Examples of the material of the low reflection layer may include MoTi, Mo, and the like. More specifically, as an example, the low reflection layer may be made of MoTi, and as another example, the low reflection layer may be made of at least one of Mo, Ti, Zr, Hf, Ta, Cr, W, V, Nb, Mn, Fe, Co, Ni, Cu, Zn, Ag, Al, Au, and an alloy of one or more thereof.

FIG. 4C is a plan view seen in the direction of arrow 499. The thin film transistor region 491 is connected to the pixel electrode 480. The low reflection layer 470 is formed under the pixel electrode. In addition, color filters 452, 454, 456 are formed in the R/G/B pixel regions respectively, and the low reflection layer 470 is formed in the white pixel region 450. The region occupied by the pixel electrode 480 is indicated by a dotted line.

Although not shown in FIGS. 4A to 4C, a light shield layer may be included.

Figure 5A:
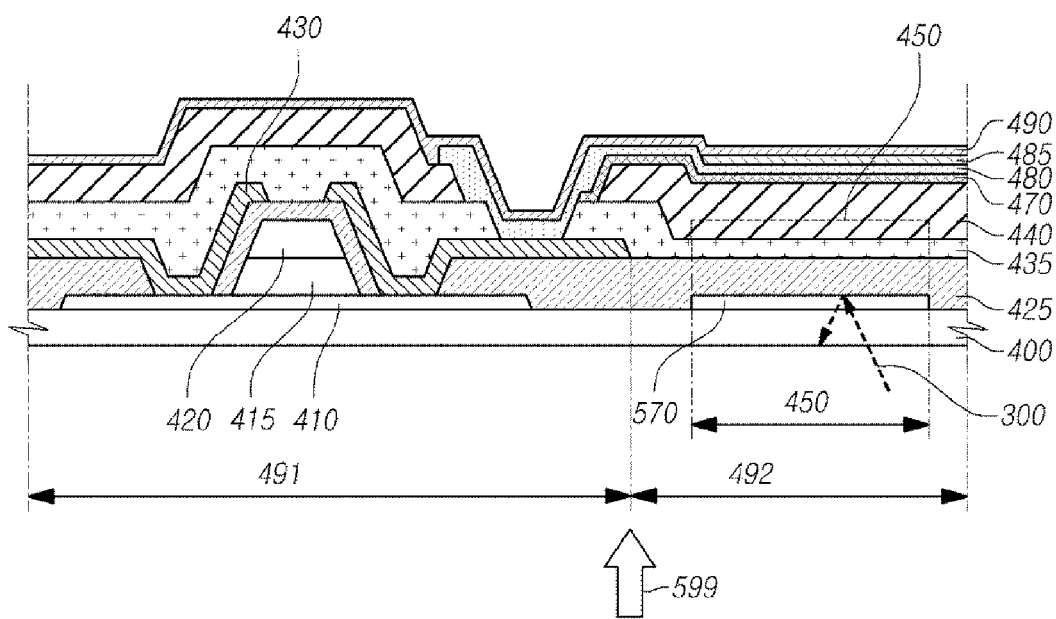
FIGS. 5A and 5B illustrate Example 1-2 of the present invention.
Figure 5B:
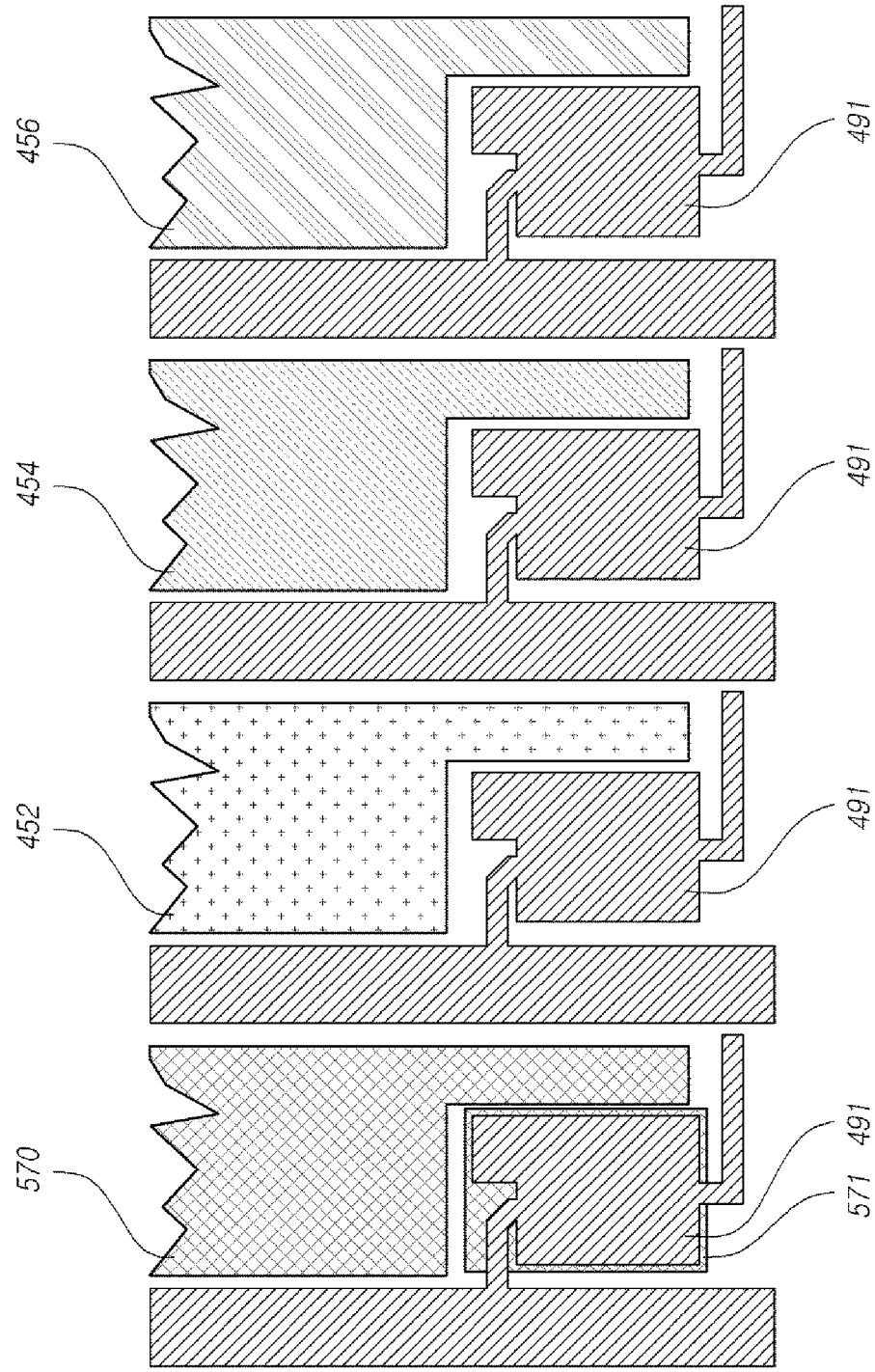

FIGS. 5A and 5B illustrate Example 1-2 of the present invention.

FIG. 5A is a sectional view of a structure in which, along with a light shield layer, a low reflection layer is formed on a substrate region corresponding to a white pixel region according to Example 1-2 of the present invention.

In FIG. 5A, the same reference numerals as those in FIG. 4A designate the same elements, so a description thereof will be replaced by the above description of FIG. 4A. No separate color filter is formed in the white pixel region 450, and a low reflection layer 570 is formed in a region on the substrate, corresponding to the white pixel region 450. External incident light 300 passes through the substrate, and experiences reduced reflection on the low reflection layer 570.

A light shield layer and a buffer layer are formed on the substrate, and the low reflection layer 570 is formed in the region on the substrate, corresponding to the white pixel region 450, by using the same material as that of the light shield layer.

FIG. 5B is a plan view seen in the direction of arrow 599. The low reflection layer 570 is formed in the region on the substrate, corresponding to the white pixel region. In addition, color filters 452, 454, 456 are formed in the R/G/B pixel regions respectively, and the low reflection layer 570 is formed in the white pixel region 450. The low reflection layer 570 and the light shield layer 571 may be formed together. FIGS. 5A and 5B correspond to an example applied to a coplanar structure, in which, when a light shield layer for protection against radiation is formed, a low reflection layer may be formed together using the same material as that of the light shield layer. However, the present invention is not limited to the coplanar structure.

Examples of the material of the low reflection layer 570 may include MoTi, Mo, and the like. More specifically, as an example, the low reflection layer may be made of MoTi, and as another example, the low reflection layer may be made of at least one of Mo, Ti, Zr, Hf, Ta, Cr, W, V, Nb, Mn, Fe, Co, Ni, Cu, Zn, Ag, Al, Au, and an alloy of one or more thereof.

The first embodiment as described in FIGS. 4A to 5C may be summarized as follows. A low reflection layer may be applied to a pixel electrode in a white pixel region, or when a light shield layer is formed, the light shield layer may also be formed as a low reflection layer in a region corresponding to a white pixel region. Further, the low reflection layer corresponding to the white pixel region may be formed in various ways. For example, the low reflection layer may be implemented as a low reflection layer formed on a passivation layer 435 or may be implemented as a low reflection layer formed on an interlayer dielectric layer.

Examples 1-1 and 1-2 may be employed at the same time or respectively, and the low reflection layer may be formed in a monolayer film structure or in a multilayer film structure of two or more materials. When the low reflection layer or the light shield layer is formed, metals having different refractive indices, metal oxides having different refractive indices, or metal nitrides having different refractive indices may be laminated in a multilayer film structure, and an example thereof may include a multilayer film of $Cu_2O$, $MoO_x$, and $TiO_2$.

In Example 1-1, the low reflection layer corresponding to the white pixel region may be formed before the pixel electrode is formed or after the overcoat is formed.

In Example 1-2, the substrate is formed, the light shield layer is formed before the interlayer dielectric layer is formed, and the light shield layer is further formed as the low reflection layer in the white pixel region.

In addition, the low reflection layer may also be formed in other regions such as RGB color filters. In this case, the low reflection layer may be formed at the same time as the color filter formation process.

The second embodiment of the present invention provides reduced reflection of external light by forming a multilayer film in a thin film transistor region and a pixel opening region in a display device from which a polarizing plate is removed. The second embodiment is divided into Examples 2-1, 2-2, 2-3, and 2-4 according to the method of forming the low reflection multilayer film.

Figure 6A:
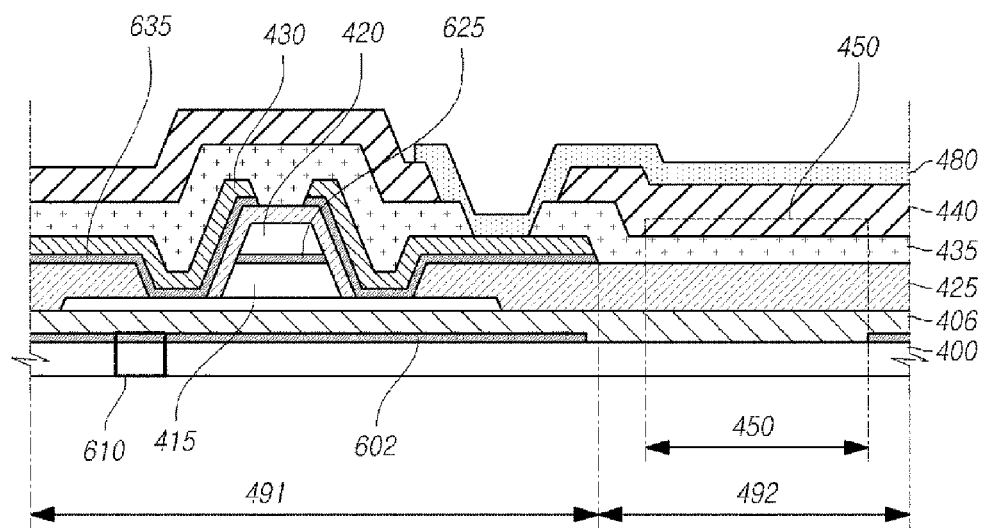
FIGS. 6A to 6C illustrate an example of achieving the low reflection effect by forming a multilayer film in a region corresponding to a thin film transistor according to Example 2-1 of the present invention.
Figure 6B:
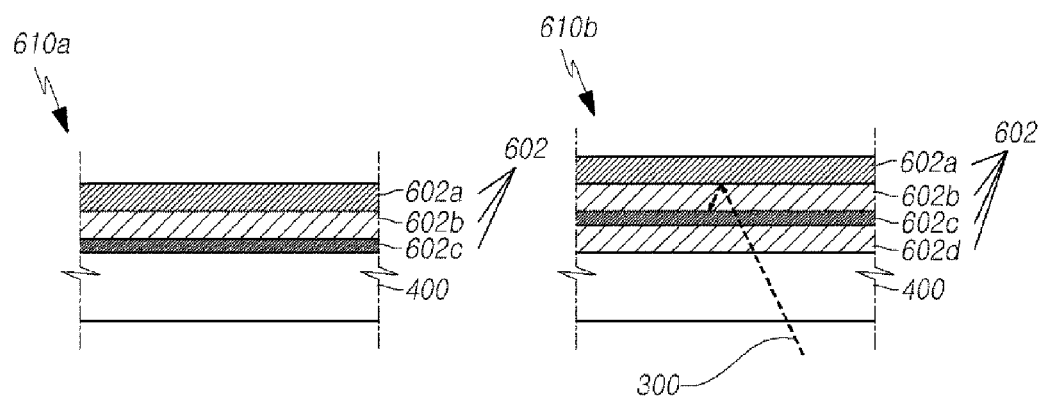
Figure 6C:
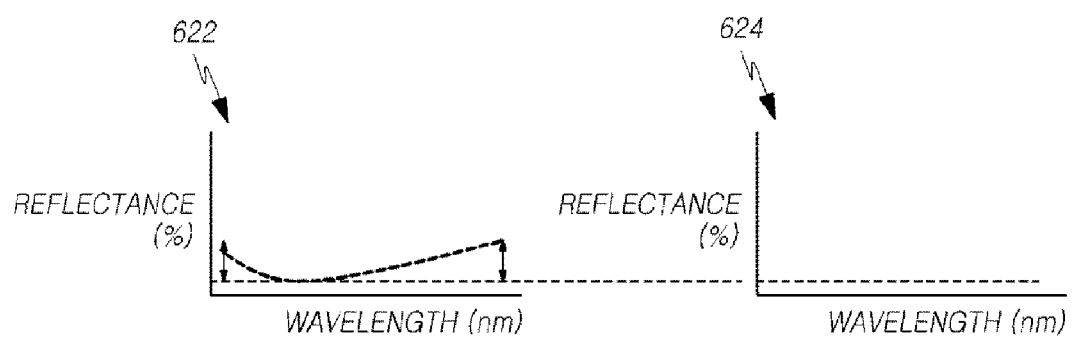

FIGS. 6A to 6C illustrate an example of achieving the low reflection effect by forming a multilayer film in a region corresponding to a thin film transistor according to Example 2-1 of the present invention. Example 2-1 employs a multilayer film to provide reduced reflection of external light, and adjusts the color of a thin film transistor region to a color close to black to uniformly improve the low reflection effect over the overall wavelength range.

FIG. 6A is a sectional view of a structure in which the low reflection effect is achieved by forming a multilayer film in a region corresponding to a thin film transistor according to Example 2-1 of the present invention.

A light shield layer 602 on the thin film transistor region 491 has low reflectivity.

A low reflection layer 635 may be selectively formed under the source/drain electrode 430. A low reflection layer 625 may also be selectively formed under the gate 420. This will be discussed in detail with reference to FIGS. 8A and 8B.

FIG. 6B shows the detailed structure of the portion 610 of the light shield layer 602 in FIG. 6A.

In FIG. 6B, reference numerals "610a" and "610b" indicate a case where the light shield layer 602 of FIG. 6A is formed as a tri-layer film and a case where the light shield layer 602 of FIG. 6A is formed as a four-layer film respectively. When the light shield layer 602 is formed as a tri-layer film as indicated by "610a", an oxide layer or a nitride layer 602b is formed between a first metal layer 602a and a second metal layer 602c.

When the light shield layer 602 is formed as a four-layer film as indicated by "610b", an oxide layer or a nitride layer 602d is further formed between the second metal layer 602c and the substrate 400. When external light is incident, reduced reflection is provided by the light shield layer 602 of a four-layer film.

FIG. 6C shows reflectance as a function of the wavelength of external light when the low reflection layer is formed as indicated by 610a and 610b of FIG. 6B.

Reference numeral "622" indicates a graph showing the relation between reflectance and the wavelength of external light when the light shield layer is formed as indicated by 610a of FIG. 6B, and it can be noted from this graph that reflectance is high in a smaller or larger wavelength range. Reference numeral "624" indicates a graph showing the relation between reflectance and the wavelength of external light when the light shield layer is formed as indicated by 610b of FIG. 6B, and it can be noted from this graph that reflectance is constant regardless of the wavelength of external light. Example 201 of the present invention can reduce reflection of external light by alternately depositing a metal layer and an oxide layer or a nitride layer to form a four-layer film as indicated by 610b of FIG. 6B.

Figure 7A:
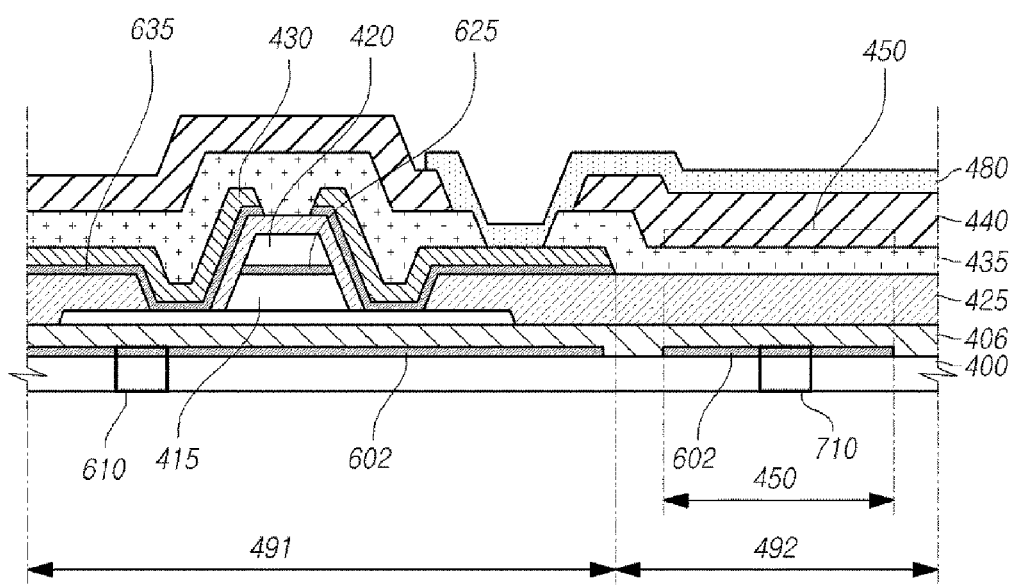
FIGS. 7A and 7B illustrate an example of achieving the low reflection effect by forming a multilayer film in a region corresponding to a thin film transistor and also forming a multilayer film in a pixel region through the same process according to Example 2-2 of the present invention.
Figure 7B:
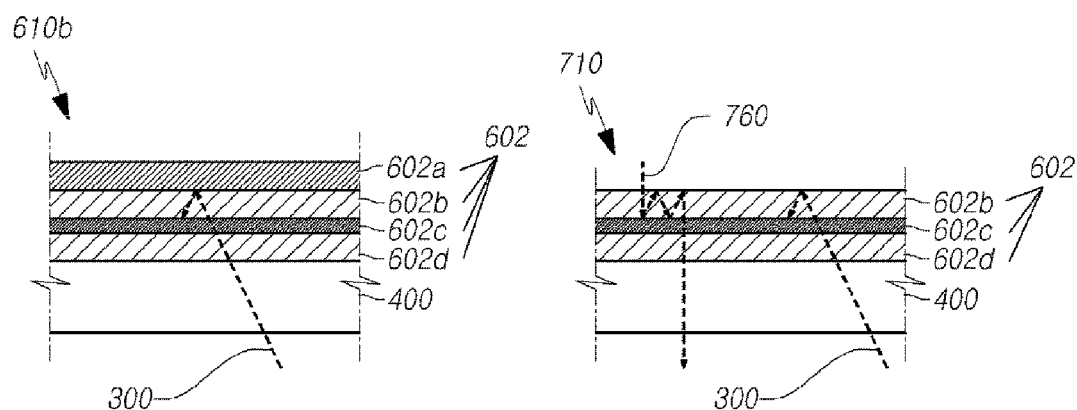

FIGS. 7A and 7B illustrate an example of achieving the low reflection effect by forming a multilayer film in a region corresponding to a thin film transistor and also forming a multilayer film in a pixel region through the same process according to Example 2-2 of the present invention. Example 2-2 applies a four-layer film as indicated by 610b of FIG. 6B to the light shield layer in the thin film transistor region. In contrast to the thin film transistor region, Example 2-2 forms a tri-layer film obtained by removing the first metal layer in the pixel region to induce the cavity effect, and thereby can improve the reflectivity of the pixel region and prevent a reduction in luminance.

FIG. 7A is a sectional view of a structure in which the low reflection effect is achieved by forming a four-layer film in a region corresponding to a thin film transistor and forming a tri-layer film in a pixel region according to Example 2-2 of the present invention.

A light shield layer 602 on the thin film transistor region 491 has low reflectivity.

A low reflection layer 635 may be selectively formed under the source/drain electrode 430. A low reflection layer 625 may also be selectively formed under the gate 420. This will be discussed in detail with reference to FIGS. 8A and 8B.

FIG. 7B shows the detailed structure of the portion 610 of the light shield layer 602 and the detailed structure of the portion 710 of the low reflection layer 702 in FIG. 7A. The structure as indicated by 610b provides reduced reflection of external light, as described above in FIG. 6B. The low reflection layer 702 in the pixel region 492 is formed in a tri-layer film structure that is obtained by removing the metal layer 602a from the light shield layer 602 in the thin film transistor region 491, and the tri-layer film includes a first oxide or nitride layer 602b, one metal layer 602c, and a second oxide or nitride layer 602d.

Accordingly, when light emits from the inside toward the outside through organic electroluminescence, the internal light emits toward the outside by the cavity effect between the first oxide or nitride layer 602b and the metal layer 602c, as indicated by reference numeral "760", while external light 300 experiences reduced reflection.

In Example 2-2, the low reflection layer 702 in the white pixel region 450 and the light shield layer 602 in the thin film transistor region 491 may be formed in the same process. However, since the low reflection layer 702 is formed as a tri-layer film, the first metal layer 602a of the light shield layer 602 is not formed in the white pixel region.

Figure 8A:
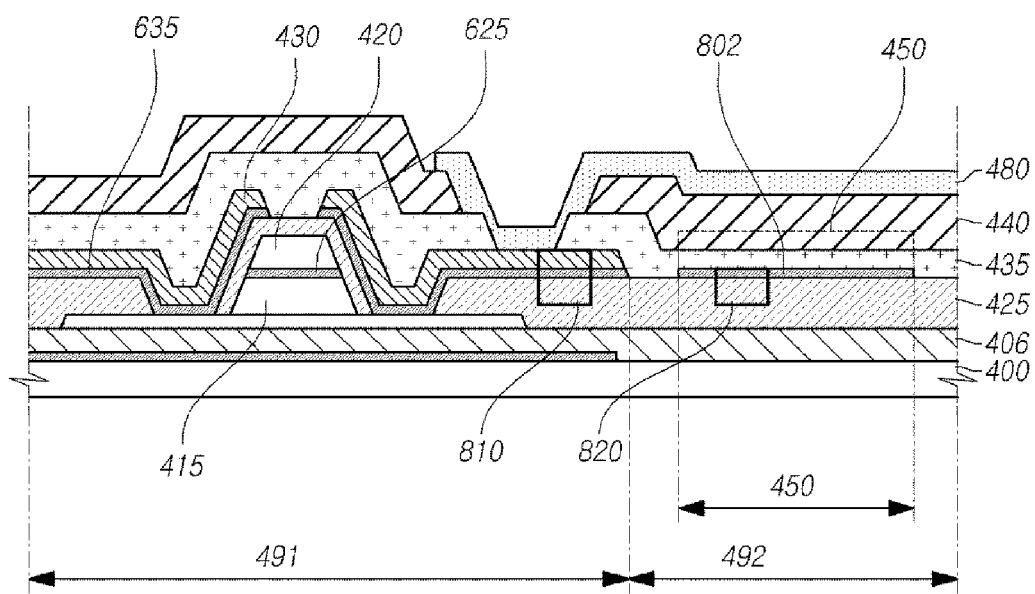
FIGS. 8A and 8B illustrate an example of making a cavity effect possible and simultaneously achieving the low reflection effect by forming a low reflection layer in a source/drain electrode portion or a gate portion of a thin film transistor and also forming a multilayer film in a pixel region according to Example 2-3 of the present invention.
Figure 8B:
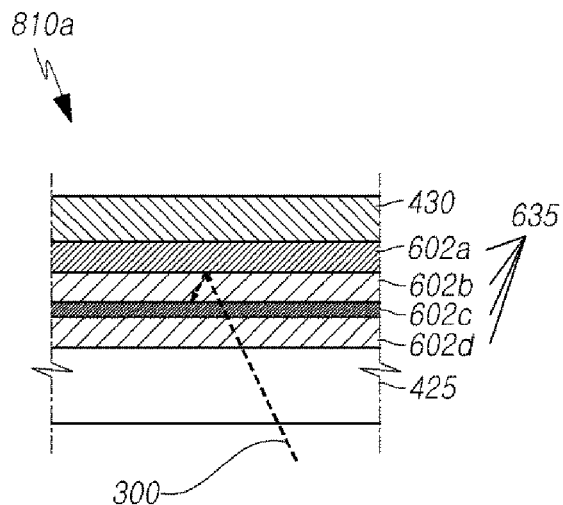
Figure 8B:
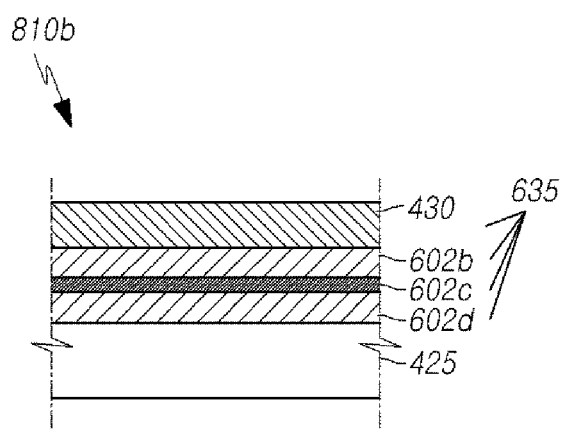
Figure 8B:
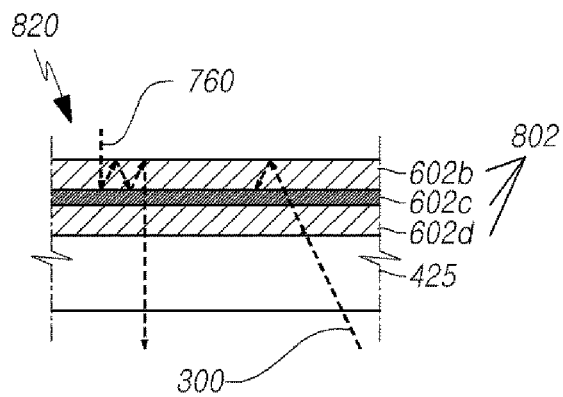

FIGS. 8A and 8B illustrate an example of making the cavity effect possible and simultaneously achieving the low reflection effect by forming a low reflection layer in a source/drain electrode portion or a gate portion of a thin film transistor and also forming a multilayer film in a pixel region according to Example 2-3 of the present invention.

FIG. 8A is a sectional view illustrating a structure according to Example 2-3 of the present invention.

In FIG. 8A, a low reflection layer 635 is formed under the source/drain electrode 430. A low reflection layer 625 is also formed under the gate 420. The low reflection layer 635 under the source/drain electrode 430 will be described with reference to FIG. 8B illustrating enlarged views of the portion 810 of FIG. 8A.

Likewise, a low reflection layer 802 formed in the white pixel region 450 through the same process as the low reflection layer 635 under the source/drain electrode 430 will also be described with reference to 820 in FIG. 8B illustrating enlarged views of the portion FIG. 8A.

FIG. 8B shows the low reflection layer under the source/drain electrode of FIG. 8A on an enlarged scale. Two structures of the portion 810 of FIG. 8A are shown on an enlarged scale and indicated by reference numerals "810a" and "810b". In the low reflection layer having the structure of 810a, a first metal layer 602a, a first oxide or nitride layer 602b, a second metal layer 602c, and a second oxide or nitride layer 602d are formed under the source/drain electrode 430, as described above in the structure of 610b of FIG. 6B. When external light is incident, reduced reflection is provided by the light shield layer 635 of a four-layer film.

As another example, in the low reflection layer having the structure of 810b, the first metal layer 602a is not formed, and only the first oxide or nitride layer 602b, the second metal layer 602c, and the second oxide or nitride layer 602d are formed under the source/drain electrode 430, as described above in the structure of 610a of FIG. 6B.

FIG. 8B shows the low reflection layer in the white pixel region of FIG. 8A on an enlarged scale. The structure of the portion 820 includes the first oxide or nitride layer 602b, one metal layer 602c, and the second oxide or nitride layer 602d, as described above in the structure of the portion 710. Accordingly, when light emits from the inside toward the outside through organic electroluminescence, the internal light emits toward the outside by the cavity effect between the first oxide or nitride layer 602b and the metal layer 602c, as indicated by reference numeral "760", while external light 300 experiences reduced reflection.

In Example 2-3, the low reflection layer 802 in the white pixel region 450 and the light shield layer 635 in the thin film transistor region 491 may be formed in the same process. However, when the low reflection layer 635 in the thin film transistor region 491 is formed as a four-layer film as shown in the structure of 810a, the low reflection layer 802 in the white pixel region 450 is formed as a tri-layer film, and thus the first metal layer 602a is not formed in the white pixel region 450.

When the low reflection layer 802 in the white pixel region 450 is formed in the same process as the low reflection layer 635 under the source/drain electrode 430, the low reflection layer 802 is formed on the interlayer dielectric layer 425. Also, when the low reflection layer 802 in the white pixel region 450 is formed in the same process as the low reflection layer 625 under the gate 420, the low reflection layer 802 is formed on the buffer layer 406.

Figure 9A:
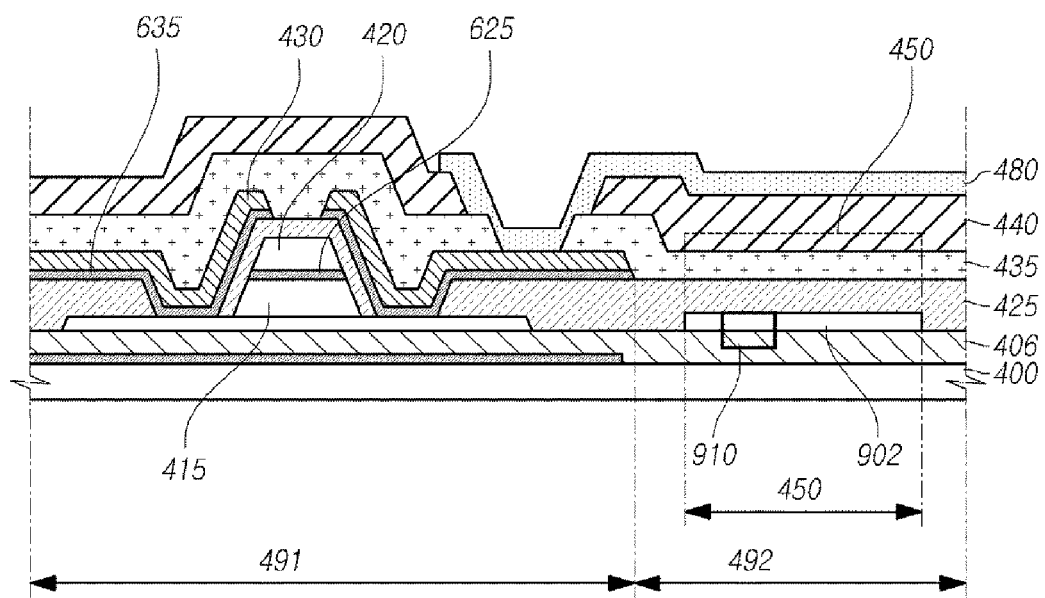
FIGS. 9A and 9B illustrate an example of achieving the cavity effect and the low reflection effect by forming an active layer in a portion corresponding to a pixel region according to Example 2-4 of the present invention.
Figure 9B:
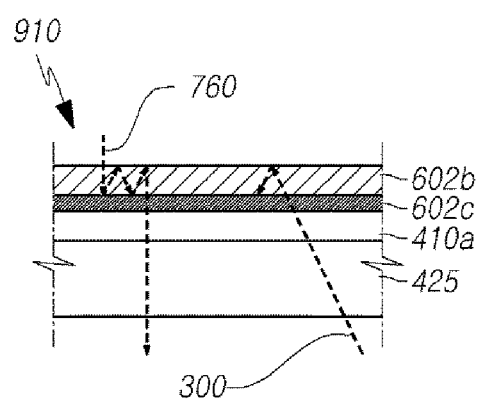

FIGS. 9A and 9B illustrate an example of achieving the cavity effect and the low reflection effect by forming an active layer in a portion corresponding to a pixel region according to Example 2-4 of the present invention.

FIG. 9A is a sectional view illustrating a structure to which Example 2-4 of the present invention is applied.

In FIG. 9A, a low reflection layer 902 is formed in a region corresponding to the white pixel region 450. The low reflection layer 902 includes the same material as that of the active layer 410. In addition, the above-mentioned low reflection layers are selectively formed under the source/drain electrode and the gate respectively.

FIG. 9B shows the structure of the portion 910 of FIG. 9A on an enlarged scale.

As shown in the drawing, the low reflection layer in the white pixel region has a tri-layer film structure in which a layer 410a made of the same material as that of the active layer 410 is laminated, and an optional oxide or nitride layer 602b and a metal layer 602c are formed on the layer 410a. This tri-layer film structure leads to the cavity effect. Accordingly, when light emits from the inside toward the outside through organic electroluminescence, the internal light emits toward the outside by the cavity effect between the oxide or nitride layer 602b and the metal layer 602c, as indicated by reference numeral "760", while external light 300 experiences reduced reflection.

Examples 2-1 to 2-4 can be summarized as follows. A low reflection layer is formed at the source/drain electrode and gate of the thin film transistor region and in the white pixel region respectively. Also, a light shield layer is formed in the thin film transistor region. The low reflection layer or the light shield layer has a tri-layer or four-layer film structure. In the case of the four-layer film structure, the low reflection layer or the light shield layer includes a first metal layer, a first oxide or nitride layer, a second metal layer, and a second oxide or nitride layer. In the case of the tri-layer film structure, the low reflection layer or the light shield layer includes a first oxide or nitride layer, a second metal layer, and a second oxide or nitride layer.

As the material of the metal layer, any one of Al, Ga, In, Ti, Zr, Hf, V, Nb, Ta, Cr, Mo, W, Mn, Tc, Re, Fe, Ru, Os, Co, Ni, Cu, Ag, and Au or an alloy of one or more thereof may be used. Also, in the tri-layer or four-layer film structure, all typical dielectric films such as $SiO_2$ and $SiN_x$ may be employed, and both low-k and high-k materials may be employed.

Further, the material of the oxide layer includes both an $InO_x$ or $ZnO_x$-based transition oxide and a metal oxide, and as an example, includes IGZO, IZO, AZO, MgO, CaO, and $Cu_2O$.

In the present invention, the low reflection layer formed in the pixel region may be simultaneously used as a layer for inducing the cavity effect. Further, the low reflection layer may be applied to all of the light shield layer, the gate, and the source/drain electrode, and one of them may be formed as a layer for inducing the cavity effect in the pixel region. In addition, as described above in the structure of 610b of FIG. 6B, a metal layer/oxide (or nitride) layer/metal layer/oxide (or nitride) layer structure may be formed, and such a structure may be applied to the light shield layer in an island type or a mesh type. Further, as described above in FIG. 9, an active layer may be formed in the pixel region to be used as a layer for inducing the cavity effect.

Referring to Examples 2-1 and 2-2, a light shield layer may be formed, and a low reflection layer from which a part of metal layers is removed may be formed in the white pixel region.

Referring to Example 2-3, before the source/drain electrode is formed, a low reflection layer may be formed in a position where the source/drain electrode is to be formed, and a further low reflection layer which is made of the same material or from which a part of metal layers is removed may be formed in the white pixel region. In a different way, before the gate is formed, a low reflection layer may be formed in a position where the gate is to be formed, and a further low reflection layer which is made of the same material or from which a part of metal layers is removed may be formed in the white pixel region.

Referring to Example 2-4, an active layer may be formed, and a low reflection layer may be formed in the white pixel region by laminating a layer made of the same material as that of the active layer, a metal layer, and an oxide/nitride layer to form a tri-layer film.

Hereinafter, a structure of the display device of FIG. 1, to which the examples of FIGS. 4A to 9B are applied, will be described.

Based on the first and second embodiments in which a low reflection layer is formed in the white pixel region, the following description will be focused on a structure for reducing reflection of unpolarized external light.

The display device includes: a data line for transmitting a data signal, the data line being arranged in a first direction on a substrate; a gate line for transmitting a gate signal, the gate line being arranged in a second direction on the substrate; a thin film transistor formed at an intersection of the gate line and the data line; a pixel electrode connected to a source electrode or a drain electrode of the thin film transistor and corresponding to a white pixel region; a low reflection layer including a metal material for reducing reflection of unpolarized external light, the low reflection layer being arranged opposite to the white pixel region; and a light shield layer arranged opposite to the thin film transistor.

As described above in Example 1-1, the low reflection layer is disposed under and overlappingly with the pixel electrode, that is, the low reflection layer may be disposed under the pixel electrode by being deposited on the pixel electrode. As in Example 1-2 in which the low reflection layer is formed in the LS process, the low reflection layer may be formed of the same material as that of the light shield layer. Referring to Example 2-1 in which the light shield layer is formed as a four-layer film, the light shield layer may be a four-layer film including a first metal layer, a first oxide or nitride layer, a second metal layer, and a second oxide or nitride layer. Referring to Example 2-3 in which a tri-layer film is formed at the source/drain electrode or the gate, a tri-layer film including a first oxide or nitride layer, a first metal layer, and a second oxide or nitride layer may be deposited on the source electrode, the drain electrode, or the gate constituting the thin film transistor.

Likewise, in Examples 2-2 and 2-3, a tri-layer film is applied to the low reflection layer in the white pixel region. The low reflection layer includes a first oxide or nitride layer, a first metal layer, and a second oxide or nitride layer, which induces the cavity effect. In Example 2-4, the low reflection layer is formed by including an active layer in the white pixel region. That is, the low reflection layer may be a tri-layer film including a first oxide or nitride layer, a first metal layer, and a semiconductor layer made of the same material as that of an active layer.

Next, reference will be made to a process for manufacturing a display device according to an embodiment of the present invention.

In a method for manufacturing a display device according to an embodiment of the present invention, a substrate is prepared, a light shield layer, a buffer layer, an active layer, a gate dielectric layer, and a gate are formed on the substrate, an interlayer dielectric layer and a source/drain electrode are formed, and then a thin film transistor is formed. Also, a passivation layer, a color filter layer, an optional overcoat, and a pixel electrode are formed.

In order to form a low reflection layer as described in Example 1-1, before the pixel electrode is formed, for example, after the overcoat is formed, a low reflection layer may be formed in a region on the overcoat, corresponding to a white pixel region. As another example, a low reflection layer may be formed at the same time as the pixel electrode when the pixel electrode is formed, and the low reflection layer may be overlapped with a transparent conductive layer for the pixel electrode. For example, a dual-layer film structure of transparent conductive layer/low reflection layer or a tri-layer film structure of transparent conductive layer/low reflection layer/transparent conductive layer or a tri-layer film structure of low reflection layer/transparent conductive layer/ low reflection layer may be formed.

In order to form a low reflection layer as described in Example 1-2, a low reflection layer may be formed in a region on a substrate, corresponding to a white pixel region, in the process of forming a light shield layer.

Unlike Examples 1-1 and 1-2, a process may be employed, in which a color filter layer is formed, and then a color filter is formed in each of RGB pixel region and a low reflection layer is formed in a white pixel region.

In order to form a low reflection layer as described in Example 2-1, a light shield layer to be formed in a thin film transistor region may be formed in a tri-layer or four-layer film structure for low reflection. Also, in Example 2-2, a low reflection layer may be formed in a region on a substrate, corresponding to a white pixel region, in the same process as a light shield layer.

The processes in Examples 1-2 and 2-2 are summarized in FIG. 10, as follows.

Figure 10:
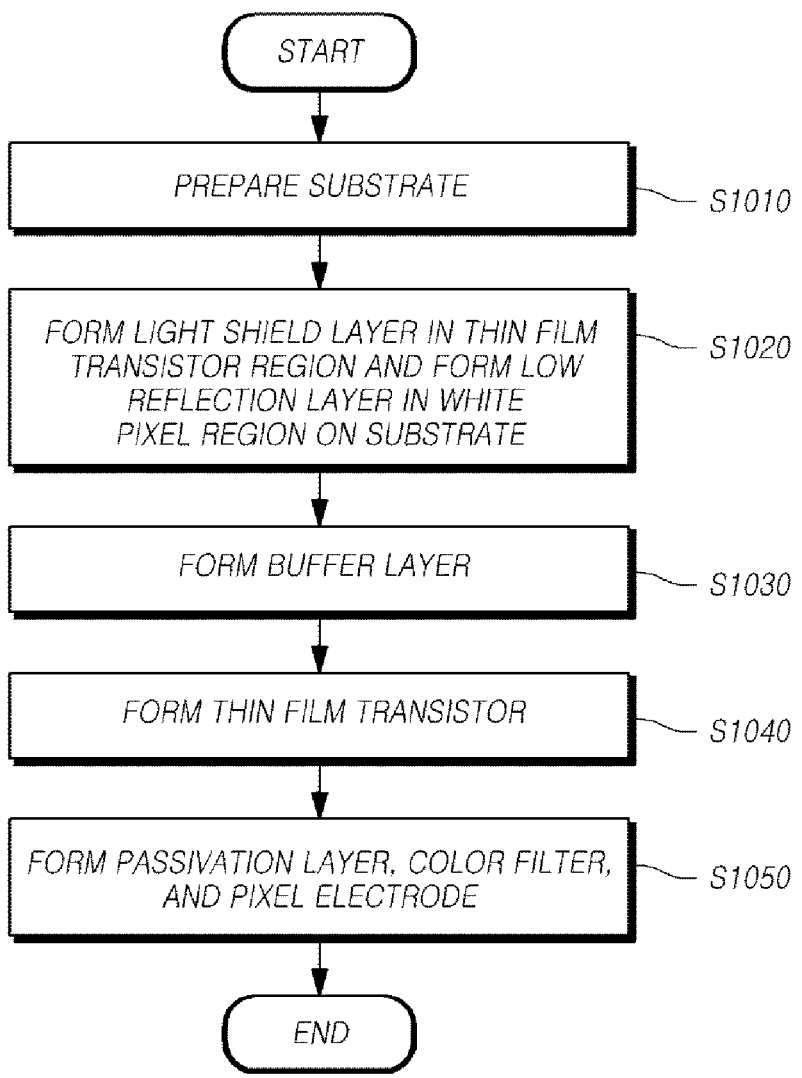
FIG. 10 is a flowchart illustrating a procedure of forming a light shield layer and a low reflection layer for a white pixel region in the same process according to an embodiment of the present invention.

FIG. 10 illustrates a procedure of forming a light shield layer and a low reflection layer for a white pixel region in the same process according to an embodiment of the present invention.

First, a substrate is prepared (S1010), and then a light shield layer is formed in a thin film transistor region corresponding to a thin film transistor and a low reflection layer is formed in a white pixel region corresponding to a white pixel on the substrate (S1020). Unlike the light shield layer, the low reflection layer may be formed in a tri-layer film structure.

Subsequently, a buffer layer is formed (S1030), the thin film transistor is formed (S1040), and then a passivation layer, a color filter, and a pixel electrode are formed (S1050).

In order to form a low reflection layer as described in Example 2-3, before a source/drain electrode is formed, a low reflection layer may be formed in a source/drain electrode region on an interlayer dielectric layer and simultaneously a further low reflection layer may be formed in a white pixel region on the interlayer dielectric layer, corresponding to a white pixel.

The flowchart of FIG. 10 includes not all the steps required to manufacture a display device, but only some of them, and some steps may be omitted or other steps may be added depending on the characteristics of the display device.

In the steps of FIG. 10, the light shield layer, the thin film transistor, the low reflection layer, the color filter, or the pixel electrode may be formed using a predetermined pattern. As the pattern, a photomask may be used, but the present invention is not limited thereto.

Figure 11:
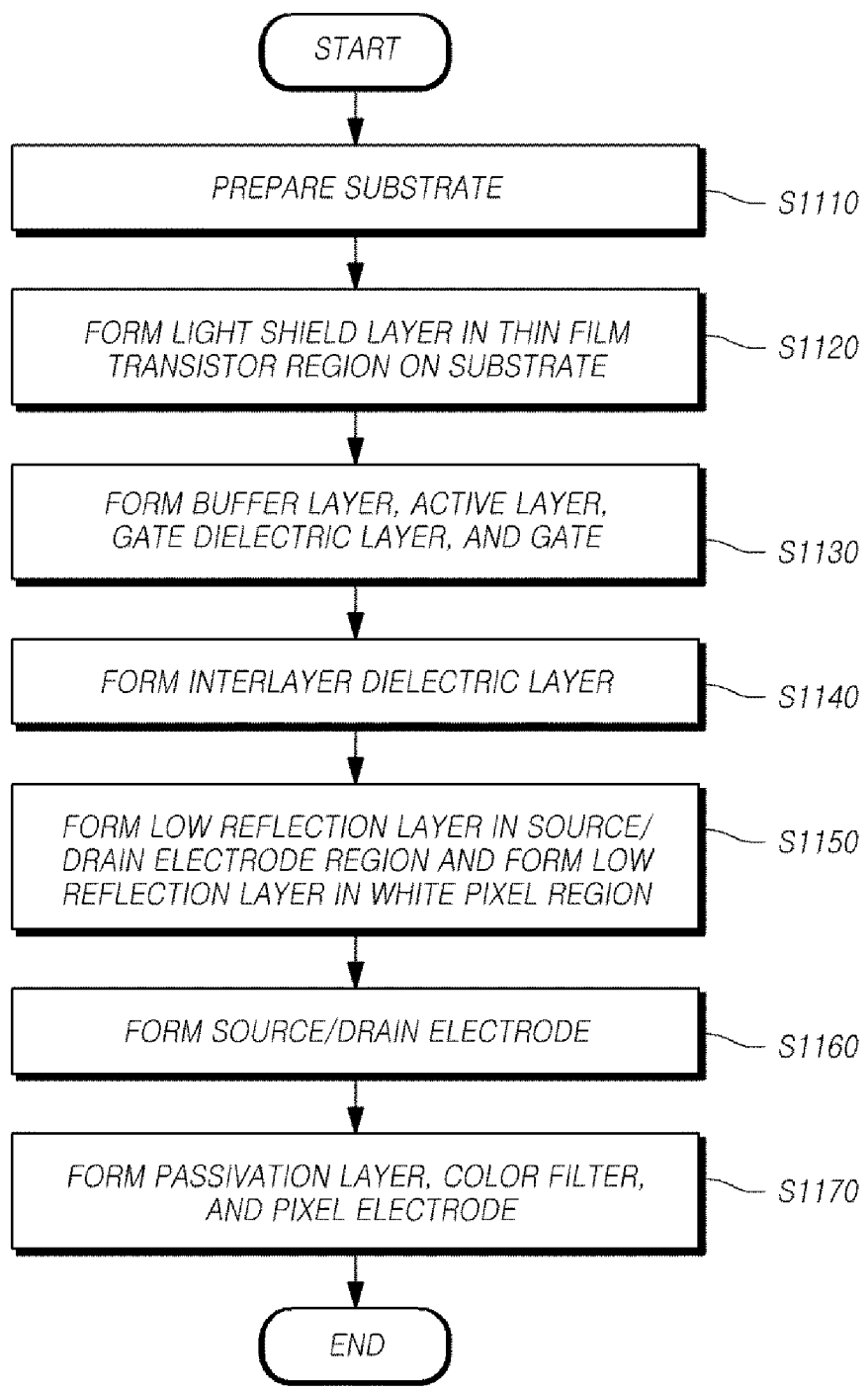
FIG. 11 is a flowchart illustrating a procedure of forming a low reflection layer for a source/drain electrode and a low reflection layer for a white pixel region in the same process according to an embodiment of the present invention.

FIG. 11 illustrates a procedure of forming a low reflection layer for a source/drain electrode and a low reflection layer for a white pixel region in the same process according to an embodiment of the present invention.

First, a substrate is prepared (S1110), a light shield layer is formed in a thin film transistor region corresponding to a thin film transistor on the substrate (S1120), and then a buffer layer, an active layer, a gate dielectric layer, and a gate are formed (S1130). Subsequently, an interlayer dielectric layer is formed (S1140), and then a low reflection layer is formed in a source/drain electrode region and a further low reflection layer is formed in a white pixel region on the interlayer dielectric layer through the same process (S1150). In this process, the low reflection layer for the white pixel region may be formed in a tri-layer film structure of oxide (or nitride) layer/metal layer/oxide (or nitride) layer. Subsequently, a source/drain electrode is formed (S1160), and then a passivation layer, a color filter layer, a pixel electrode, and the like may be formed (S1170). The flowchart of FIG. 11 includes not all the steps required to manufacture a display device, but only some of them, and some steps may be omitted or other steps may be added depending on the characteristics of the display device.

In the steps of FIG. 11, the active layer, the gate dielectric layer, the gate, the source/drain electrode, the low reflection layer, the color filter, or the pixel electrode may be formed using a predetermined pattern. As the pattern, a photomask may be used, but the present invention is not limited thereto.

Figure 12:
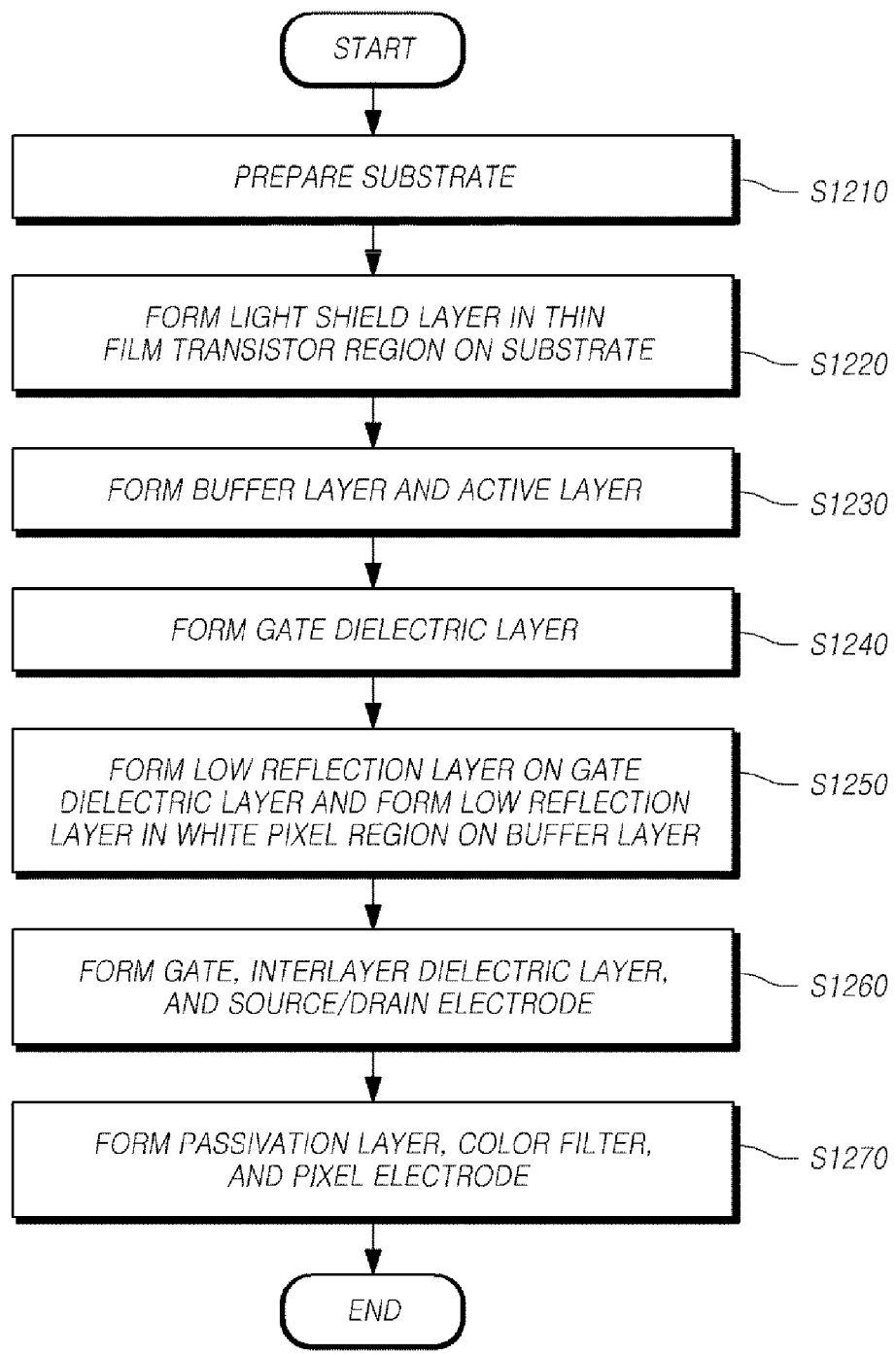
FIG. 12 is a flowchart illustrating a procedure of forming a low reflection layer for a gate and a low reflection layer for a white pixel region in the same process according to an embodiment of the present invention.

FIG. 12 illustrates a procedure of forming a low reflection layer for a gate and a low reflection layer for a white pixel region in the same process according to an embodiment of the present invention.

First, a substrate is prepared (S1210), a light shield layer is formed in a thin film transistor region corresponding to a thin film transistor on the substrate (S1220), and then a buffer layer and an active layer are formed (S1230). Also, a gate dielectric layer is formed (S1240). Subsequently, a low reflection layer is formed on the gate dielectric layer, and a further low reflection layer is formed in a white pixel region on the buffer layer (S1250). Also, a gate, an interlayer dielectric layer, and a source/drain electrode are formed (S1260), and then a passivation layer, a color filter layer, a pixel electrode, and the like may be formed (S1270). The flowchart of FIG. 12 includes not all the steps required to manufacture a display device, but only some of them, and some steps may be omitted or other steps may be added depending on the characteristics of the display device.

In the steps of FIG. 12, the active layer, the gate dielectric layer, the gate, the source/drain electrode, the low reflection layer, the color filter, or the pixel electrode may be formed using a predetermined pattern. As the pattern, a photomask may be used, but the present invention is not limited thereto.

In order to form a low reflection layer as described in Example 2-4, a low reflection layer may be formed in a region on a buffer layer, corresponding to a white pixel region, in the process of forming an active layer.

The present invention may be applied to, but is not limited to oxide semiconductors that have an etch stopper layer (ESL) structure and a back channel etch (BCE) structure among bottom gate staggered structures. The present invention may also be applied to, but is not limited to, a top gate coplanar structure and a top gate staggered structure.

Further, the present invention may be applied to, but is not limited to, a zinc oxide (ZnO) semiconductor, an indium zinc oxide (IZO) semiconductor, an indium aluminum zinc oxide (IAZO) semiconductor, an indium gallium zinc oxide (IGZO) semiconductor, or an indium tin zinc oxide (ITZO) semiconductor.

When the source/drain electrode is made of a Mo/Ti alloy, a separate low reflection layer is not formed for the source/drain electrode, and the source/drain electrode itself may serve as a low reflection layer. Also, such a material of the source/drain electrode may be used to form a low reflection layer for a white pixel region. This is also the same for the gate.

Examples 1-1 and 1-2 are technologies for overcoming the deterioration of visual sensitivity due to the reflectivity of a Wpxl region in a WRGB structure, and the reflectivity of the Wpxl region can be improved by a light shield layer or by applying a low reflection layer to a pixel electrode. When Examples 1-1 and 1-2 are employed, a polarizing film or a polarizing plate can be removed while the reflectance of the white pixel region is lowered, and thus visual sensitivity can be improved and excellent luminance characteristics can be ensured.

According to Examples 2-1 to 2-4, the deterioration of visual sensitivity due to differences between reflectances according to wavelengths in the visible range of 400 nm to 700 nm can be improved, low reflectivity can be obtained over the overall range, and low reflectivity can be ensured and simultaneously luminance can be improved using the cavity effect in the light-emitting opening. In order to achieve a structure without a polarizing plate or a polarizing film in manufacturing an OLED display panel, a low reflection layer may be formed in the white pixel region, the light shield layer, and the thin transistor region respectively. Also, in order to ensure the stability of an oxide thin film transistor, a low reflection layer as a multilayer film that has a black color and thus is excellent in visual sensitivity is applied to the light shield layer and the wiring portions respectively, and simultaneously such a multilayer film is also applied to the pixel region, in particular, the white pixel region. In this way, luminance in the pixel region is improved, and thus a reduction in luminance in the pixel region is prevented.

Although the embodiments of the present invention have been described for illustrative purposes, those skilled in the art will appreciate that various modifications, additions and substitutions are possible, without departing from the scope and spirit of the invention. Accordingly, the embodiments disclosed in the present invention are merely to not limit but describe the technical spirit of the present invention. Further, the scope of the technical spirit of the present invention is limited by the embodiments. The scope of the present invention shall be construed on the basis of the accompanying claims in such a manner that all of the technical ideas included within the scope equivalent to the claims belong to the present invention.

What is claimed is:

1. An organic light emitting display device comprising:
   a data line arranged in a first direction on a substrate;
   a gate line arranged in a second direction on the substrate;
   a thin film transistor arranged at an intersection of the gate line and the data line;
   a pixel electrode connected to a source electrode or a drain electrode of the thin film transistor and corresponding to a white pixel region;
   a low reflection layer being arranged in the white pixel region; and
   a light shield layer arranged opposite the thin film transistor and contacting the substrate.

2. The organic light emitting display device of claim 1, wherein the low reflection layer is arranged on and physically contacting the pixel electrode.

3. The organic light emitting display device of claim 1, wherein the low reflection layer is made of a same material as the light shield layer.

4. The organic light emitting display device of claim 1, wherein the light shield layer comprises a four-layer film comprising:
   a first metal layer;
   a first oxide layer or a first nitride layer;
   a second metal layer; and
   a second oxide layer or a second nitride layer.

5. The organic light emitting display device of claim 1, wherein the source electrode, the drain electrode, or the gate constituting the thin film transistor comprises a tri-layer film comprising:
   a first oxide layer or a first nitride layer;
   a first metal layer; and
   a second oxide layer or a second nitride layer.

6. The organic light emitting display device of claim 1, wherein the low reflection layer comprises a tri-layer film comprising:
   a first oxide layer or a first nitride layer;
   a first metal layer; and
   a second oxide layer or a second nitride layer.

7. The organic light emitting display device of claim 1, wherein the low reflection layer comprises a tri-layer film comprising:
   a first oxide layer or a fist nitride layer;
   a first metal layer; and
   a semiconductor layer made of the same material as an active layer of the thin film transistor.

8. The organic light emitting display device of claim 1, wherein the low reflection layer is disposed between the substrate and a buffer layer.

9. The organic light emitting display device of claim 1, wherein the light shield layer is disposed between the substrate and a buffer layer.

* * * * *